United States Patent [19]
Chiang et al.

[11] Patent Number: 5,707,896
[45] Date of Patent: Jan. 13, 1998

[54] METHOD FOR PREVENTING DELAMINATION OF INTERLEVEL DIELECTRIC LAYER OVER FET P+ DOPED POLYSILICON GATE ELECTRODES ON SEMICONDUCTOR INTEGRATED CIRCUITS

[75] Inventors: An-Min Chiang, Hsinchu; Shau-Tsung Yu, Taipei; Yeh-Jye Wann, Hsinchu; Pei-Hung Chen, Hsin-chu, all of Taiwan

[73] Assignee: Taiwan Semiconductor Manuacturing Company, Ltd., Hsin-chu, Taiwan

[21] Appl. No.: 714,734

[22] Filed: Sep. 16, 1996

[51] Int. Cl.⁶ .............................. H01L 21/8238
[52] U.S. Cl. .......................... 438/231; 438/660
[58] Field of Search ...................... 438/230, 231, 438/303, 305, 522, 532, 660

[56] References Cited

U.S. PATENT DOCUMENTS

| | | | |
|---|---|---|---|
| 5,407,847 | 4/1995 | Hayden et al. | 438/305 |
| 5,434,096 | 7/1995 | Chu et al. | 438/305 |
| 5,567,638 | 10/1996 | Lin et al. | 438/532 |

OTHER PUBLICATIONS

S. Wolf, "Silicon Processing for the VLSI Era–Vol2" Lattice Press, Sunset Beach, CA, p. 398; (1990).

*Primary Examiner*—Chandra Chaudhari
*Attorney, Agent, or Firm*—George O. Saile; Stephen B. Ackerman

[57] ABSTRACT

A method is described for forming P-channel field effect transistors having shallow source/drain junctions and improved reliability for CMOS circuits. The method involves forming both N-channel and P-channel FETs on the same substrate by alternate photoresist masking and ion implantation. The self-aligned source/drain areas for the P-channel FETs are formed by implanting boron difluoride ($BF_2$) ions. In more conventional processing, the $BF_2$ ions that are implanted in the P-channel FET gate electrodes during the source/drain implant results in out-gassing of fluorine from the gate electrodes after the interlevel dielectric (ILD) layer is deposited. This can result in void formation, or delamination, at the interface between the gate electrode and the ILD. The current invention provides an improved process which out-diffuses the fluorine atoms prior to depositing the ILD, and thereby prevents the formation of voids after the ILD is deposited and subsequent high-temperature process steps are performed.

18 Claims, 2 Drawing Sheets

METHOD FOR PREVENTING DELAMINATION OF INTERLEVEL DIELECTRIC LAYER OVER FET P+ DOPED POLYSILICON GATE ELECTRODES ON SEMICONDUCTOR INTEGRATED CIRCUITS

BACKGROUND OF THE INVENTION

(1) Field of the Invention

The present invention relates to the fabrication of integrated circuit devices on semiconductor substrates, and more particularly relates to a method for making shallow junction P-channel field effect transistors using boron difluoride ($BF_2^+$) ion implantation without fluorine out-gassing causing delamination of the overlying interlevel dielectric (ILD) layer.

(2) Description of the Prior Art

As the field effect transistors (FETs) decrease in size and the packing density (circuit density) and performance improve on integrated circuit chips, the power consumed by the individual transistors dramatically increases. It is necessary to find ways to reduce the power consumption. One important method is to form the logic-gates or inverter using Complementary Metal Oxide Silicon (CMOS) circuits. These CMOS circuits use both N-channel and P-channel FETs, and are desirable because of the low power consumption. Typically in a single N-channel inverter, a relatively high steady current is present in the standby mode. As the number of FETs increases on the chip, the high power consumption becomes unacceptable. In the CMOS circuit (inverter) only one of the two transistors is on at any time, and virtually no current flows because of the high-impedance, and no dc power is dissipated in the standby mode. This means that very high density ultra-large scale integrated (ULSI) circuits can be made without requiring expensive packaging for cooling.

The conventional CMOS circuits are formed in and on single crystalline semiconductor substrates (silicon) by fabricating the N-channel FETs in P-wells in the silicon substrate, and P-channel FETs in N-wells also formed in and on the substrate. However, as the channel lengths become smaller (e.g., less than 0.5 micrometers), short channel effects can adversely affect the FET electrical characteristics. For example, threshold voltage ($V_{th}$) shifts and drain-to-source punchthrough can occur. One method to reduce these effects is to reduce the source/drain junction depth. Typically, the shallow $N^+$ source/drains for the N-channel FETs are formed by implanting the relatively heavy ions arsenic ($As^{75}$) and pose no problem because of the small projected ion range in the silicon. However, for the $P^+$ source/drain (P-channel FETs), the implants for the relatively low mass boron ($B^{11}$) have a larger projected implant range, and the problem is further complicated by the high diffusivity of boron. The boron also has a longer implant tail due to channeling of the lower mass boron. One common method of overcoming this deep junction for $P^+$ source/drains is to implant a heavier ion that also contains boron, such as $BF_2$ (mass number 49). Unfortunately, several problems arise due the presence of the fluorine. Since the source/drains are self-aligned to the polysilicon FET gate electrode, which are used to mask the implant over the channel regions, the $BF_2$ is also implanted into the polysilicon gate. One problem is the enhanced diffusion of the boron in the gate oxide during the post-implant anneal above about 800° C. when $BF_2$ is used as the implant ion. This problem is described, for example, in Silicon Processing for the VLSI Era, VOL. 2, by S. Wolf, published by Lattice Press, Sunset Beach, Calif., 1990, pp. 398. Another serious problem that also occurs at relatively high post-implant processing temperatures is the out-gassing of the fluorine atoms after the ILD layer is deposited. This problem is best understood by referring to the cross-sectional view of the completed P-channel FET depicted in FIG. 1. The P-FET is formed on and in an N-well region on a silicon substrate 10. Shown is the gate oxide 18 on which is patterned a $P^+$ doped polysilicon layer 20($P^+$) having sidewall spacers 26. The shallow source/drain regions 24 and 32 are formed by implanting $BF_2$ ions and are self-aligned to the gate electrode 20($P^+$). The gate electrode is therefore also heavily doped with $BF_2$. When the ILD layer composed of the silicon nitride layer 34 and the BPSG layer 36 are deposited and high temperature processing is carried out, the fluorine atoms, depicted by the arrows 5, outgas from the surface of the gate electrode 20($P^+$) in void formation or delamination at the $P^+$ doped polysilicon/ILD interface, thereby causing reliability problems.

Therefore, there is still a strong need in the semiconductor industry for a more reliable process for fabricating P-channel FETs having shallow source/drain contacts without the void formation caused by the fluorine outgassing.

SUMMARY OF THE INVENTION

It is therefore a principal object of this invention to provide P-channel field effect transistors (FETs) having $P^+$ shallow source/drain contacts using $BF_2$ implantation.

It is another object of this invention to provide reliable P-channel FETs by preventing the formation of voids at the interface between the $P^+$ polysilicon gate electrodes and overlying insulating layer by out-diffusion of fluorine after the $BF_2$ source/drain implant.

It is still another object of this invention to provide a method for making N-channel and P-channel FETs on the same substrate for fabricating CMOS circuits.

The method for making CMOS structures with P-channel FETs having shallow source/drain regions formed by implanting boron difluoride ($BF_2$) ions begins by providing a single crystal silicon substrate. Field OXide (FOX) regions are formed on the surface of the substrate surrounding and electrically isolating device areas. N-wells and P-wells are formed in the device areas for making P-channel and N-channel FETs, respectively. A gate oxide for the FETs is formed on the surface of the N- and P-wells. An undoped polysilicon layer is deposited on the substrate. The polysilicon layer over the N-wells is doped $P^+$ while the regions over the P-wells are masked with photoresist. After stripping the photoresist, the P-wells are doped with an $N^+$ dopant while masking the P-wells with photoresist. The doped polysilicon layer is then patterned to form gate electrodes for the N-channel and the P-channel FETs. The patterned polysilicon layer can also serve as local interconnections over the FOX regions, such as on static random access memory (SRAM) circuits, logic circuits, and the like. Lightly doped drains (LDDs) are now formed in the device areas adjacent to the gate electrodes while using a photoresist implant mask to mask areas where implants are not desired. $N^-$ LDDs are formed in the P-well regions and $P^-$ LDDs are formed in the N-well regions.

Sidewall spacers are formed next on the sidewalls of the gate electrodes by depositing a conformal first insulating layer and anisotropically etching back the first insulating layer. The source/drain regions are formed next. The heavily doped source/drain for the N-channel FETs are formed by implanting an N-type dopant, such as arsenic, in the P-well regions adjacent to sidewall spacers, while masking from implant the N-well regions by using a photoresist mask. The source/drain regions for the P-channel FETs are formed by implanting a P$^+$ dopant and more specifically by implanting boron difluoride (BF$_2$) by masking the P-well regions with a photoresist mask. Since the polysilicon gate electrodes are used as an implant mask to form the self-aligned P$^+$ source/drain regions, the polysilicon gate electrodes are also heavily doped with BF$_2$. As discussed in the prior art, voids or delamination will occur if an interlevel dielectric (ILD) layer is present on the gate electrodes during subsequent high-temperature processing.

After removing the photoresist, a key step in the current invention is to anneal the substrate prior to depositing an ILD layer. This results in outgassing of the fluorine atoms from the P$^+$ doped patterned polysilicon layer, which essentially eliminates voids or delamination between the P$^+$ polysilicon layer and the ILD layer that is later deposited and annealed at elevated temperatures. A second insulating layer composed of silicon nitride (Si$_3$N$_4$) is blanket deposited over the substrate and protects the FETs from ionic contamination, such as sodium ions. A third insulating layer composed of borophosphosilicate glass (BPSG) is deposited on the second insulating layer and is levelled by thermal anneal to form essentially a locally planar surface. This completes the fabrication of the CMOS structure having P-channel FET gate electrodes which are free of voids between the patterned P$^+$ doped polysilicon layer and the ILD layer.

BRIEF DESCRIPTION OF THE DRAWINGS

The object and other advantages of this invention are best understood by the following embodiment with reference to the attached drawings which are now briefly described.

DESCRIPTION OF THE PREFERRED EMBODIMENTS

Figure 3:
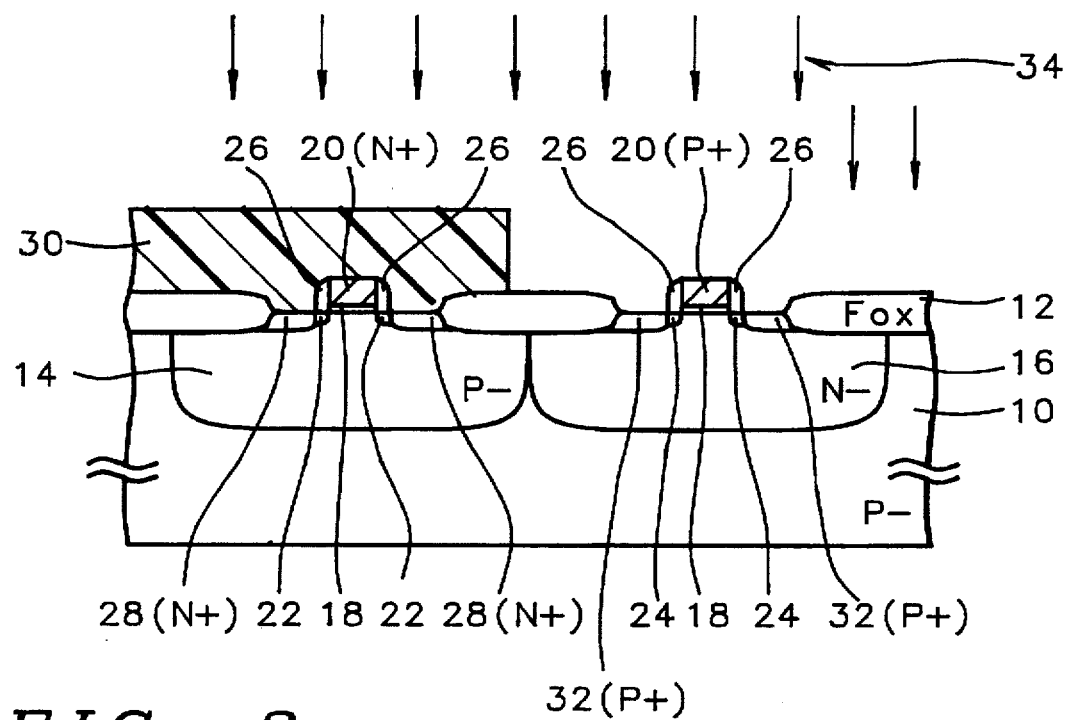
Figure 4:
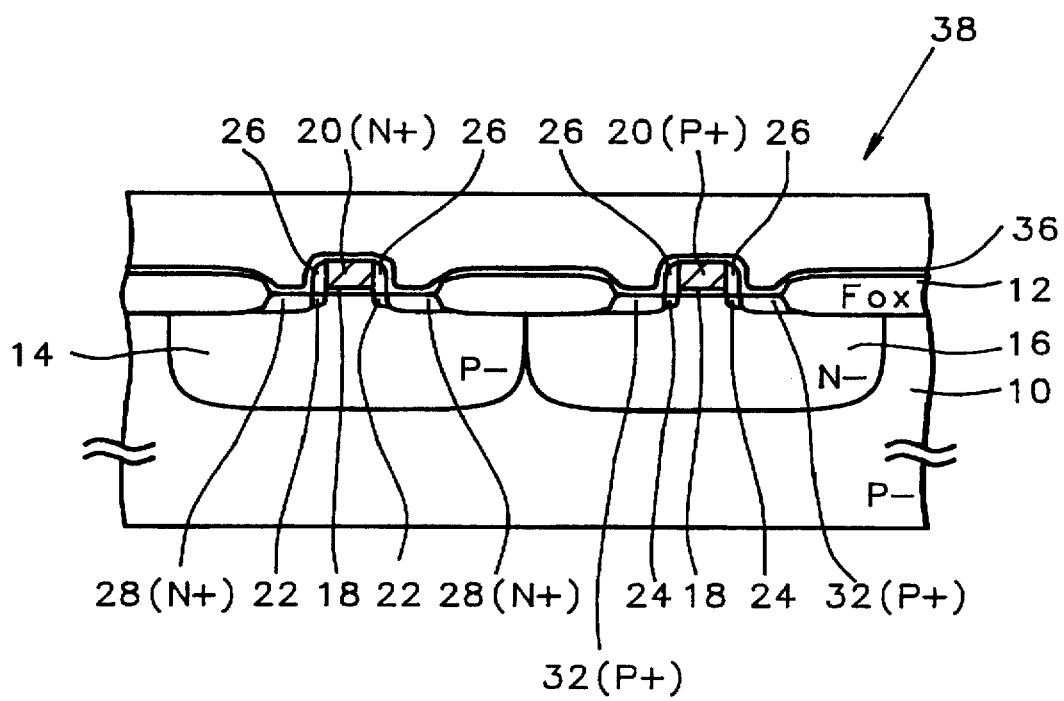

Now in keeping with the objects of this invention, the method for forming a CMOS structure having an improved P-channel FET is covered in detail. The method involves using BF$_2$ ion implantation to fabricate shallow source/drain junctions while avoiding the delamination between the P$^+$ doped polysilicon layer and the overlying ILD layer. The sequence of fabrication steps is shown in FIGS. 2 through 4.

It should also be well understood by one skilled in the art that although the invention is described for eliminating the voids formed on P-channel FETs for the purpose of making reliable CMOS circuits, the method equally applies to other devices and areas on the substrate where boron difluoride (BF$_2$) implanted polysilicon is used.

Figure 1:
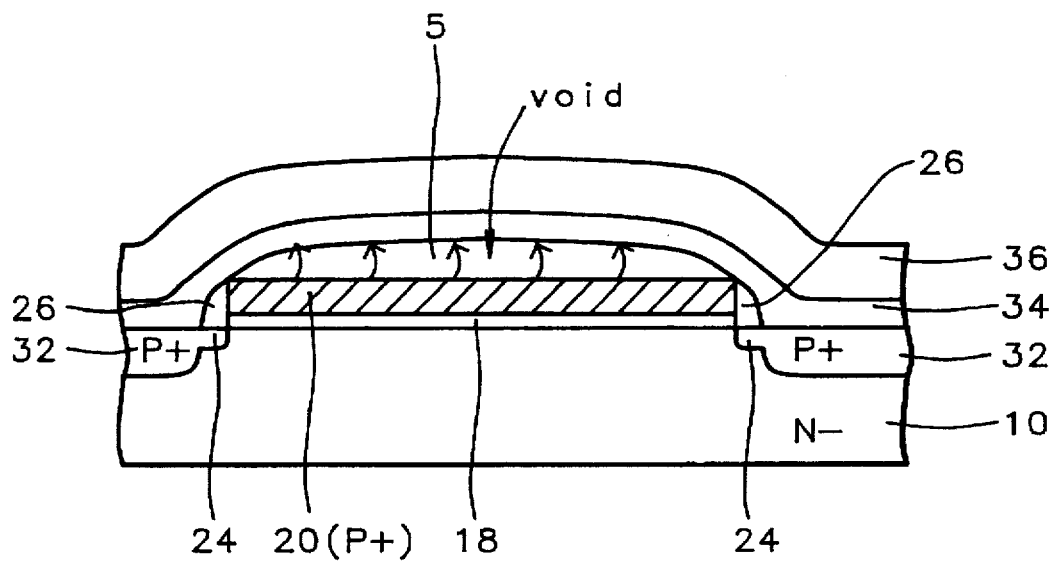
FIG. 1 shows a schematic cross-sectional view of a P-channel FET depicting the problem of void formation or delamination between a P-doped polysilicon gate and the overlying interlevel dielectric (ILD) layer.
Figure 2:
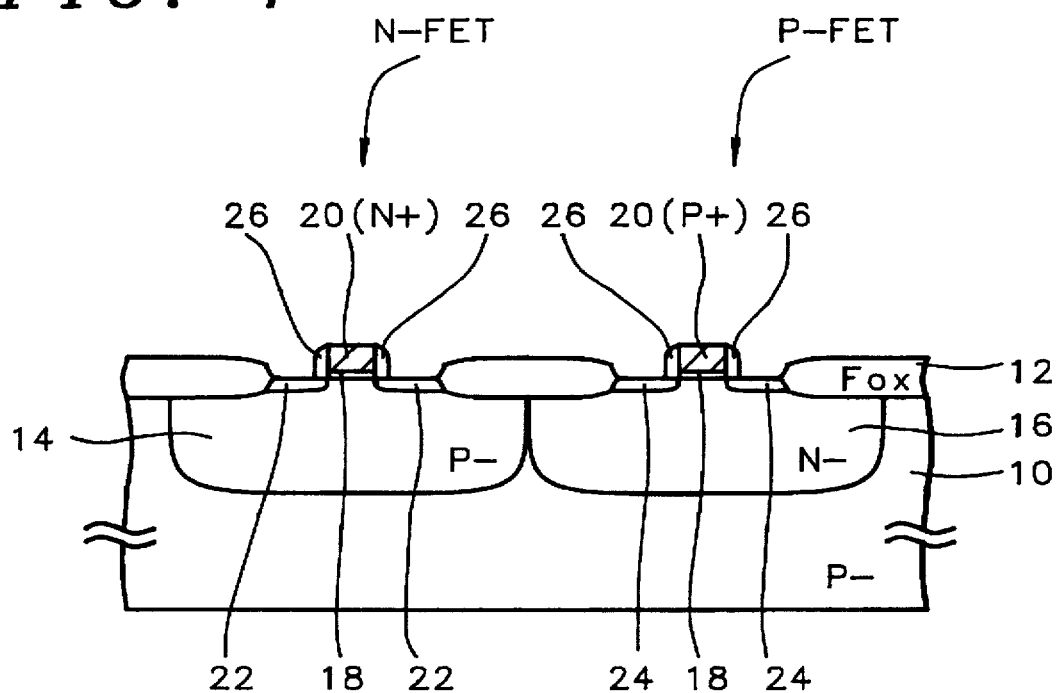
FIGS. 2 through 4 show schematic cross-sectional views depicting the sequence of processing steps for forming a P- and N-channel FET used in the fabrication of CMOS circuits in which the P-channel FET fabricated by this invention is free of voids between the gate electrodes and the overlying ILD layer.

Referring now to FIG. 2, a cross-sectional view of the substrate 10 having a partially completed N-channel and P-channel FET is shown. The preferred substrate is composed of a P-type single crystalline silicon having a <100> crystallographic orientation. The individual device areas are electrically isolated by a relatively thick Field OXide (FOX) 12. For example, the FOX can be formed by conventional means, such as the LOCal Oxidation of Silicon (LOCOS), in which a thin silicon oxide (pad oxide) and a thicker silicon nitride (Si$_3$N$_4$) layer are used as a barrier layer to oxidation. Conventional photolithographic techniques and etching are then used to remove the barrier layer over the regions where the FOX is desired, while retaining the Si$_3$N$_4$ over areas where the active devices are to be fabricated. The substrate 10 is then oxidized to form the FOX 12. Typically, the FOX is grown to a thickness of between about 4500 and 5500 Angstroms.

The P- and N-channel FETs are formed in the active device regions after removing the Si$_3$N$_4$ barrier layer and the pad oxide. The P-wells and N-well are formed in the active device regions, as shown in FIG. 2, by ion implanting a P-type dopant, such as boron (B$^{11}$), in the P-well regions 14 and a N-type dopant, such as arsenic (As$^{75}$) in the N-well regions 16. Conventional photolithographic techniques are used to form implant block-out masks to prevent implanting the P-dopant in the N-wells and the N-dopant in the P-wells. The substrate is then appropriately annealed to achieve the desired dopant profiles, activate the dopant, and remove the implant damage. Typically, the wells are between about 2.0 and 3.0 micrometers deep and are doped to a concentration of between about 1.0 E 15 and 1.0 E 17 atoms/cm$^3$.

The N- and P-channel FET devices are formed next by first thermally oxidizing the active device regions to form a thin gate oxide 18. The preferred thickness of the gate oxide is between about 100 and 300 Angstroms.

Still referring to FIG. 2, the method for forming the N- and P-channel FETs is now described. An undoped polysilicon layer 20 is deposited on the substrate 10, and is preferably deposited to a thickness of between about 2000 and 5000 Angstroms. Polysilicon layer 20 is doped P$^+$ over the N-wells 16, while the polysilicon layer 20 over the P-wells 14 is masked with a photoresist block-out mask to prevent implanting P$^+$ dopant in that portion of layer 20 over the P-wells. After stripping the photoresist block-out mask, the polysilicon layer 20 over the P-wells is doped with an N$^+$ dopant while masking the polysilicon layer 20 over the N-wells with a photoresist block-out mask. To simplify the discussion and the Fig., the doping of polysilicon layer 20 and photoresist masking steps are not explicitly shown in FIG. 2. Preferably, the N$^+$ dopant is carried out by implanting arsenic (As$^{75}$) ions having a concentration of between about 1.0 E 19 and 1.0 E 21 ions/cm$^3$, and preferably the P$^+$ dopant is performed by implanting boron (B$^{11}$) providing a concentration of between about 1.0 E 19 and 1.0 E 21 ions/cm$^3$.

Using conventional photolithographic techniques and anisotropic plasma etching, the doped polysilicon layer 20 is patterned to form gate electrodes 20 for the N-channel and the P-channel FETs. Preferably the polysilicon can be etched using reactive ion etching (RIE) or a high plasma density and using an etchant gas having a high selectivity of polysilicon to oxide, such as a gas containing chlorine (Cl) species. The polysilicon layer 20 patterned over the FOX regions 12 can also serve to provide local interconnections, such as on static random access memory (SRAM) circuits, logic circuits, and the like.

N$^-$ lightly doped source/drain (LDD) regions 22 are formed next in the device areas adjacent to the N-channel FET gate electrodes 20(N$^+$) while using a photoresist block-out mask to mask areas over the P-channel FET regions where the N$^-$ implants are not desired. The block-out masks are not depicted in FIG. 2. The P⁻ LDDs regions 24 are similarly formed in the N-well regions for the P-channel FETs. The N⁻ LDDs are usually formed by implanting an N-type dopant species such as arsenic ($As^{75}$) or phosphorus ($P^{31}$). For example, a typical implant might consist of $P^{31}$ at a dose of between about 1.0 E 13 and 1.0 E 14 ions/cm², and an energy of between about 30 and 80 KeV. The P⁻ LDDs are preferably formed by implanting a P-type dopant species, such as $BF_2$. For example, a typical implant dose might consist of $BF_2$ at a dose of between about 1.0 E 13 and 5.0 E 13 atoms/cm², and at an implant energy of between about 40 and 60 KeV.

After completing the LDDs, sidewall spacers 26 are formed next on the sidewalls of the gate electrodes 20. A conformal first insulating layer is deposited and is anisotropically etched back to the silicon substrate 10 to form the sidewall spacers 26. For example, first insulating layer can be a silicon oxide ($SiO_2$) deposited by chemical vapor deposition (CVD) using tetraethoxysilane (TEOS) at a temperature in the range of about 650 to 900° C. The etch back is performed in a reactive ion etcher at low pressure.

Referring now to FIG. 3, the source/drain regions are formed next. The FIG. depicts the process after the N⁺ source/drain areas 28(N⁺) in the P-wells 14 are formed. These wells are formed by providing a photoresist mask over the N-well areas 16 and implanting, for example, arsenic ($As^{75}$) in the device areas adjacent to the sidewall spacers 26 in the P-well areas 14. For example, the $As^{75}$ can be implanted at a dose of 2.0 E 15 to 1.0 E 16 ions/cm² and at an energy of between about 20 and 70 KeV. Now, more specifically relating to the method of this invention, a photoresist mask 30 is used as a block-out mask over the P-well regions 14 for implanting the P⁺ source/drain regions 32(P⁺) using an ion source of boron difluoride ($BF_2$) as depicted by the arrows 34 in FIG. 3. Preferably the $BF_2$ implant dose is between about 1.0 E 15 and 1.0 E 16 ions/cm², and more specifically an implant dose of 3.0 E 15 ions/cm². The implant energy is between about 50 and 90 KeV.

During the implantation of the $BF_2$ to form the self-aligned source/drain contacts 32(P⁺), the P-channel FET polysilicon gate electrodes 20(P⁺) also are heavily implanted with $BF_2$ ions. As mentioned in the prior art, voids or delamination will occur at the interface between polysilicon gate electrodes and an interlevel dielectric (ILD) layer. This delamination results from out-diffusion of the fluorine from the polysilicon surface during subsequent thermal processing in the presence of the ILD layer. Continuing with the method, and key to the current invention, after removing the photoresist layer 30, the substrate 10 is annealed prior to depositing an ILD layer. This results in outgassing of the fluorine atoms from the P⁺ doped patterned polysilicon layer 20, thereby eliminating the fluorine outgassing at a later process step that causes voids or delamination between the P⁺ polysilicon layer 20 and the ILD layer that is later deposited and annealed at elevated temperatures. Preferably the annealing to degas the P⁺ polysilicon layer 20 is carried out in a nitrogen ambient at a temperature between about 750 and 900° C. and more specifically at a temperature of 800° C. The annealing temperature and time are sufficient to outgas completely the fluorine atoms, and preferably for a time between about 20 and 60 minutes.

Referring to FIG. 4, the interlevel dielectric layer composed of a second insulating layer 36 and a third insulating layer 38 are then deposited to provide the electrical insulation between the FETs and the next level of metal wiring. Preferably, layer 36 is composed of silicon nitride ($Si_3N_4$) and is deposited by low pressure chemical vapor deposition (LPCVD) using a reactant gas such as dichlorosilane ($SiCl_2H_2$) and ammonia ($NH_3$) at a temperature of between about 750 and 850° C. Layer 36 acts as a part of a capacitor dielectric and also protects the FETs from ionic contamination. Layer 36 also provides a diffusion barrier to prevent the boron dopant in the third insulating layer 38, which is composed of borophosphosilicate glass (BPSG), from diffusing into the N-channel FET source/drain areas 28(N⁺). A third insulating layer 38 composed of a low-flow-temperature glass is then deposited on layer 36 and is annealed to locally planarize the surface. The material of choice is a borophosphosilicate glass (BPSG), and the preferred thickness is between about 5000 and 7000 Angstroms. BPSG layer 38 can be deposited using, for example, plasma enhanced chemical vapor deposition (PECVD) using, for example, silane ($SiH_4$) and oxygen ($O_2$) doped with phosphine ($PH_3$) and a boron dopant such as $B_2H_6$. Alternatively, a doped BPSG can be deposited using TEOS by adding appropriate dopants. The BPSG is then planarized by reflowing in nitrogen at a temperature between about 850° and 920° C. for about 30 to 90 minutes.

This completes the fabrication of the N- and P-channel FETs for building a CMOS structure in which the P-channel FETs are free of voids or delamination between the patterned P⁺ doped polysilicon layer 20 and the ILD layer (layers 36 and 38).

While the invention has been particularly shown and described with reference to the preferred embodiments thereof, it will be understood by those skilled in the art that various changes in form and details may be made without departing from the spirit and scope of the invention.

What is claimed is:

1. A method for fabricating P-channel and N-channel field effect transistors (FETs) with improved P-channel FETs comprising the steps of:

providing a semiconductor substrate having device areas surrounded and electrically isolated by field oxide regions, said device areas having N-wells for P-channel FETs and P-wells for N-channel FETs;

forming a gate oxide on said N- and P-wells;

depositing a polysilicon layer on said substrate and doping said polysilicon over said P-wells with an N-type dopant and doping said polysilicon over said N-wells with a P-type dopant;

patterning said polysilicon layer and thereby forming gate electrodes for said N-channel and said P-channel FETs;

masking said N-wells with a photoresist mask and implanting lightly doped N- source/drain regions in said P-wells adjacent to said gate electrodes;

masking said P-wells with a photoresist mask and implanting lightly doped P- source/drain regions in said N-wells adjacent to said gate electrodes;

depositing a conformal first insulating layer over said gate electrodes and elsewhere over said substrate;

anisotropically etching back said first insulating layer and thereby forming sidewall spacers on said gate electrodes;

masking said N-wells with a photoresist mask and implanting N⁺ source/drain regions in said P-wells adjacent to said sidewall spacers;

masking said P-wells with a photoresist mask and implanting P⁺ source/drain regions in said N-wells adjacent to said sidewall spacers using $BF_2$ ions;

annealing said substrate and degassing fluorine atoms from said P-channel gate electrodes;

depositing a conformal second insulating layer over said gate electrodes and elsewhere on said substrate;

depositing a third insulating layer on said second insulating layer and planarizing said third insulating layer, said prior degassing anneal of said fluorine atoms from said P-channel FET gate electrodes preventing void formation between said P-channel gate electrodes and said second insulating layer during subsequent high-temperature processing.

2. The method of claim 1, wherein said polysilicon layer is deposited to thickness of between about 2000 and 5000 Angstroms.

3. The method of claim 1, wherein said lightly doped P-source/drain regions are implanted with $BF_2$ ions.

4. The method of claim 3, wherein said $BF_2$ ions are implanted at an implant dose of between 1.0 E 13 and 5.0 E 13 ions/cm$^2$ and an energy of between about 40 and 60 KeV.

5. The method of claim 1, wherein said P$^+$ source/drain regions are implanted with said $BF_2$ at an implant dose of between 1.0 E 15 and 1.0 E 16 ions/cm$^2$ and an energy of between about 50 and 90 KeV.

6. The method of claim 1, wherein said annealing of said substrate to degas said fluorine atoms is carried out in a nitrogen ($N_2$) ambient at a temperature of between about 750° and 900° C. for between about 20 and 60 minutes.

7. The method of claim 1, wherein said second insulating layer is silicon nitride ($Si_3N_4$) having a thickness of between about 100 and 600 Angstroms.

8. The method of claim 1, wherein said third insulating layer is a borophosphosilicate glass (BPSG) deposited to a thickness of between about 5000 and 7000 Angstroms.

9. The method of claim 8, wherein said BPSG is planarized by annealing in oxygen ($O_2$) and nitrogen ($N_2$) at a temperature of between about 850° and 920° C., for between about 30 and 90 minutes.

10. A method for fabricating P-channel and N-channel field effect transistors (FETs) with improved P-channel FETs for CMOS circuits comprising the steps of:

providing a semiconductor substrate having device areas surrounded and electrically isolated by field oxide regions, said device areas having N-wells for P-channel FETs and P-wells for N-channel FETs;

forming a gate oxide on said N- and P-wells;

depositing a polysilicon layer on said substrate and doping said polysilicon over said P-wells with an N-type dopant and doping said polysilicon over said N-wells with a P-type dopant;

patterning said polysilicon layer and thereby forming gate electrodes for said N-channel and said P-channel FETs;

masking said N-wells with a photoresist mask and implanting lightly doped N- source/drain regions in said P-wells adjacent to said gate electrodes;

masking said P-wells with a photoresist mask and implanting lightly doped P- source/drain regions in said N-wells adjacent to said gate electrodes;

depositing a conformal first insulating layer over said gate electrodes and elsewhere over said substrate;

anisotropically etching back said first insulating layer and thereby forming sidewall spacers on said gate electrodes;

masking said N-wells with a photoresist mask and implanting N$^+$ source/drain regions in said P-wells adjacent to said sidewall spacers;

masking said P-wells with a photoresist mask and implanting P$^+$ source/drain regions in said N-wells adjacent to said sidewall spacers using $BF_2$ ions;

annealing said substrate and degassing fluorine atoms from said P-channel gate electrodes;

depositing a conformal second insulating layer composed of silicon nitride ($Si_3N_4$) over said gate electrodes and elsewhere on said substrate;

depositing a third insulating layer composed of borophosphosilicate glass (BPSG) on said second insulating layer and leveling by thermal anneal said third insulating layer, said prior degassing anneal of said fluorine atoms from said P-channel FET gate electrodes preventing void formation between said P-channel gate electrodes and said second insulating layer during said thermal anneal and subsequent high-temperature processing.

11. The method of claim 10, wherein said polysilicon layer is deposited to thickness of between about 2000 and 5000 Angstroms.

12. The method of claim 10, wherein said lightly doped P-source/drain regions are implanted with $BF_2$ ions.

13. The method of claim 12, wherein said $BF_2$ ions are implanted at an implant dose of between 1.0 E 13 and 5.0 E 13 ions/cm$^2$ and an energy of between about 40 and 60 KeV.

14. The method of claim 10, wherein said P$^+$ source/drain regions are implanted with said $BF_2$ at an implant dose of between 1.0 E 15 and 1.0 E 16 ions/cm$^2$ and an energy of between about 50 and 90 KeV.

15. The method of claim 10, wherein said annealing of said substrate to degas said fluorine atoms is carried out in a nitrogen ($N_2$) ambient at a temperature of between about 750° and 900° C. for between about 20 and 60 minutes.

16. The method of claim 10, wherein said second insulating layer has a thickness of between about 100 and 600 Angstroms.

17. The method of claim 10, wherein said third insulating layer is deposited to a thickness of between about 5000 and 7000 Angstroms.

18. The method of claim 10, wherein said BPSG is planarized by annealing in oxygen ($O_2$) and nitrogen ($N_2$) at a temperature of between about 850° and 920° C., for between about 30 and 90 minutes.

\* \* \* \* \*